(12) United States Patent
Nakamura et al.

(10) Patent No.: US 7,123,301 B1
(45) Date of Patent: *Oct. 17, 2006

(54) PIXEL GAIN AMPLIFIER

(75) Inventors: Katsu Nakamura, Boston, MA (US); Steven Decker, Derry, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/579,646

(22) Filed: May 26, 2000

Related U.S. Application Data (60) Provisional application No. 60/138,960, filed on Jun. 11, 1999.

(51) Int. Cl.
*H04N 5/217* (2006.01)
*H03F 1/14* (2006.01)

(52) U.S. Cl. .................... 348/301; 327/124; 330/9

(58) Field of Classification Search ............... 348/241, 348/255, 300; 330/9, 86, 110, 254, 260, 330/278, 282, 291, 293; 250/214 A, 214 LA, 250/214 LS, 214 AG, 214 C
See application file for complete search history.

(56) References Cited

U.S. PATENT DOCUMENTS

| | | | | |
|---|---|---|---|---|
| 4,446,438 A | * | 5/1984 | Chang et al. ............... 327/337 |
| 4,806,874 A | * | 2/1989 | Michel ........................... 330/9 |
| 5,084,639 A | * | 1/1992 | Ribner ........................ 327/311 |
| 5,703,524 A | * | 12/1997 | Chen ........................... 327/560 |
| 5,736,886 A | * | 4/1998 | Mangelsdorf et al. ...... 327/310 |
| 5,757,230 A | * | 5/1998 | Mangelsdorf ............... 330/133 |
| 5,757,440 A | * | 5/1998 | Mangelsdorf ............ 340/573.4 |
| 6,166,766 A | * | 12/2000 | Moore et al. ............... 348/241 |
| 6,288,387 B1 | * | 9/2001 | Black et al. ............. 250/214 A |
| 6,342,919 B1 | * | 1/2002 | Opris ......................... 348/241 |
| 6,346,968 B1 | * | 2/2002 | Domer et al. ............ 348/223.1 |
| 6,433,632 B1 | * | 8/2002 | Nakamura et al. ............. 330/9 |
| 6,441,684 B1 | | 8/2002 | Nakamura |
| 6,441,686 B1 | | 8/2002 | Nakamura |
| 6,529,237 B1 | * | 3/2003 | Tsay et al. .................. 348/241 |
| 6,587,143 B1 | * | 7/2003 | Boisvert ..................... 348/241 |
| 2005/0195645 A1 | * | 9/2005 | Panicacci et al. ........... 365/156 |

OTHER PUBLICATIONS

Gregorian and Temes, "Analog MOS Integrated Circuits for Signal Processing," Wiley-Interscience, 1986, pp. 412-417.

* cited by examiner

*Primary Examiner*—David Ometz
(74) *Attorney, Agent, or Firm*—Wolf Greenfield & Sacks, P.C.

(57) ABSTRACT

A correlated double sampling pixel gain amplifier includes an operational amplifier, an input sampling capacitor, and a feedback capacitor. The input capacitor samples the input signal during a first time phase and the feedback capacitor receives the signal charge from the input capacitor. No sampling switch is located between the input capacitor and the input terminal. The feedback capacitor may include a capacitor array.

17 Claims, 12 Drawing Sheets

CDS/PxGA Circuit with Offset Correction

PIXEL GAIN AMPLIFIER

RELATED APPLICATIONS

This application claims the benefit, under 35 U.S.C. §119(e), of the filing date of provisional application Ser. No. 60/138,960, filed Jun. 11, 1999.

This application is related to Ser. No. 09/579,748 filed May 26, 2000.

FIELD OF THE INVENTION

The present invention is related to a programmable gain amplifier.

BACKGROUND

A charge-coupled device (CCD) output waveform is a sequence of pixels, where each pixel is represented as the difference between a reset level and a data level. This signal waveform is initially processed before being passed on to the automatic gain control (AGC) circuit:

The data level is subtracted from the reset level on a pixel-by-pixel basis to remove the reset noise component common to both signals. This operation is called correlated double-sampling (CDS).

Figure 1:
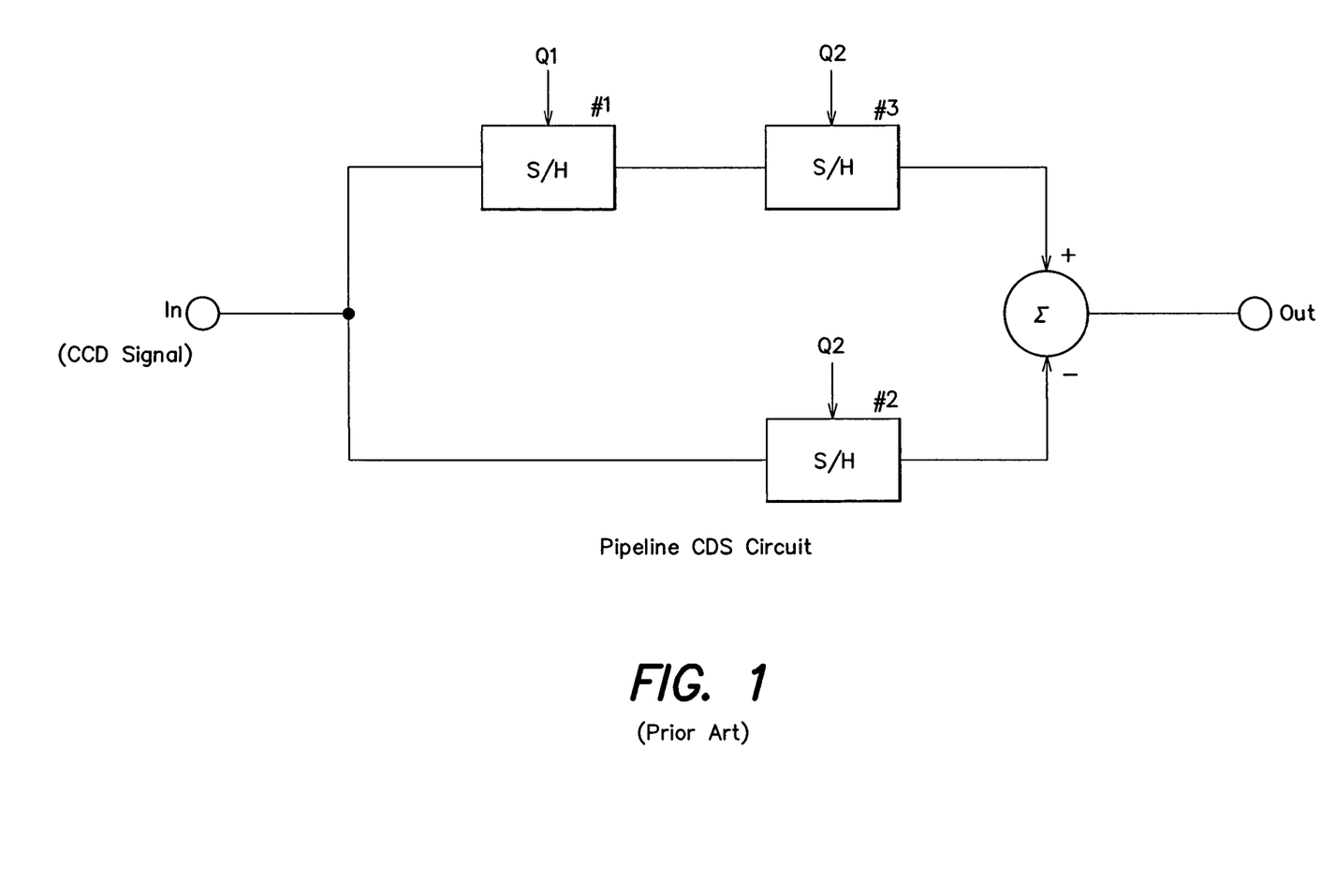
FIG. 1 is a block diagram of a pipeline CDS circuit according to the prior art.
Figure 2:
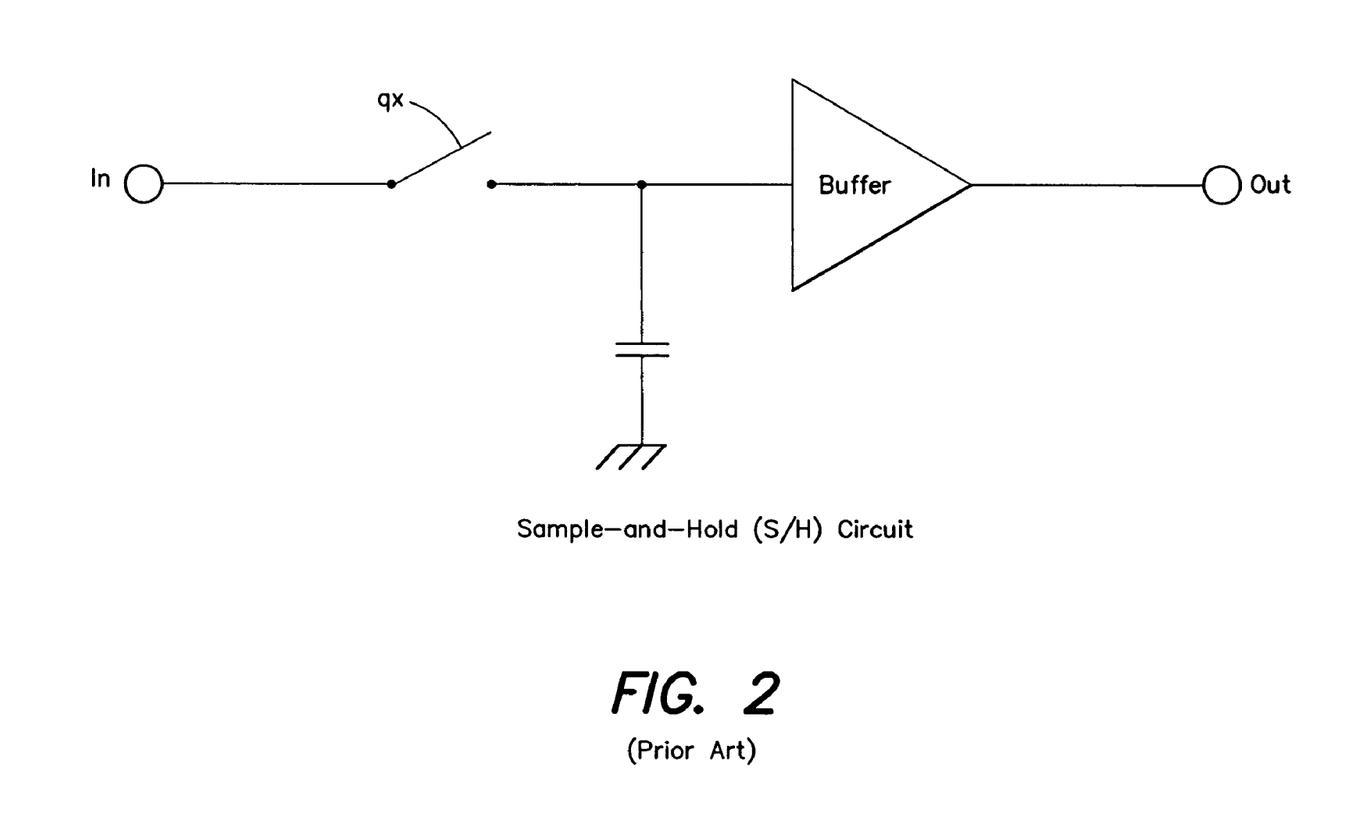
FIG. 2 is a block diagram of a sample and hold circuit according to the prior art.

One prior art CDS is shown in block diagram form in FIG. 1. This is a pipelined CDS circuit. It has two non-overlapping time phases of operation: In the Q1 phase of the pipelined CDS circuit, the reset level is sampled by sample-and-hold (S/H) #1. A schematic diagram of a typical S/H is shown in FIG. 2. In the Q2 phase, the data level is sampled by S/H #2. Simultaneously, S/H #3 samples the output of S/H #1.

Drawbacks of the pipelined CDS technique are: (1) there are three sampling operations, which increases the noise over techniques requiring only two sampling operations; and (2) any gain or offset mismatch between the reset path (S/H #1 and S/H #3) and the data path (S/H #2) limits the ability of the CDS to remove reset noise.

Figure 3:
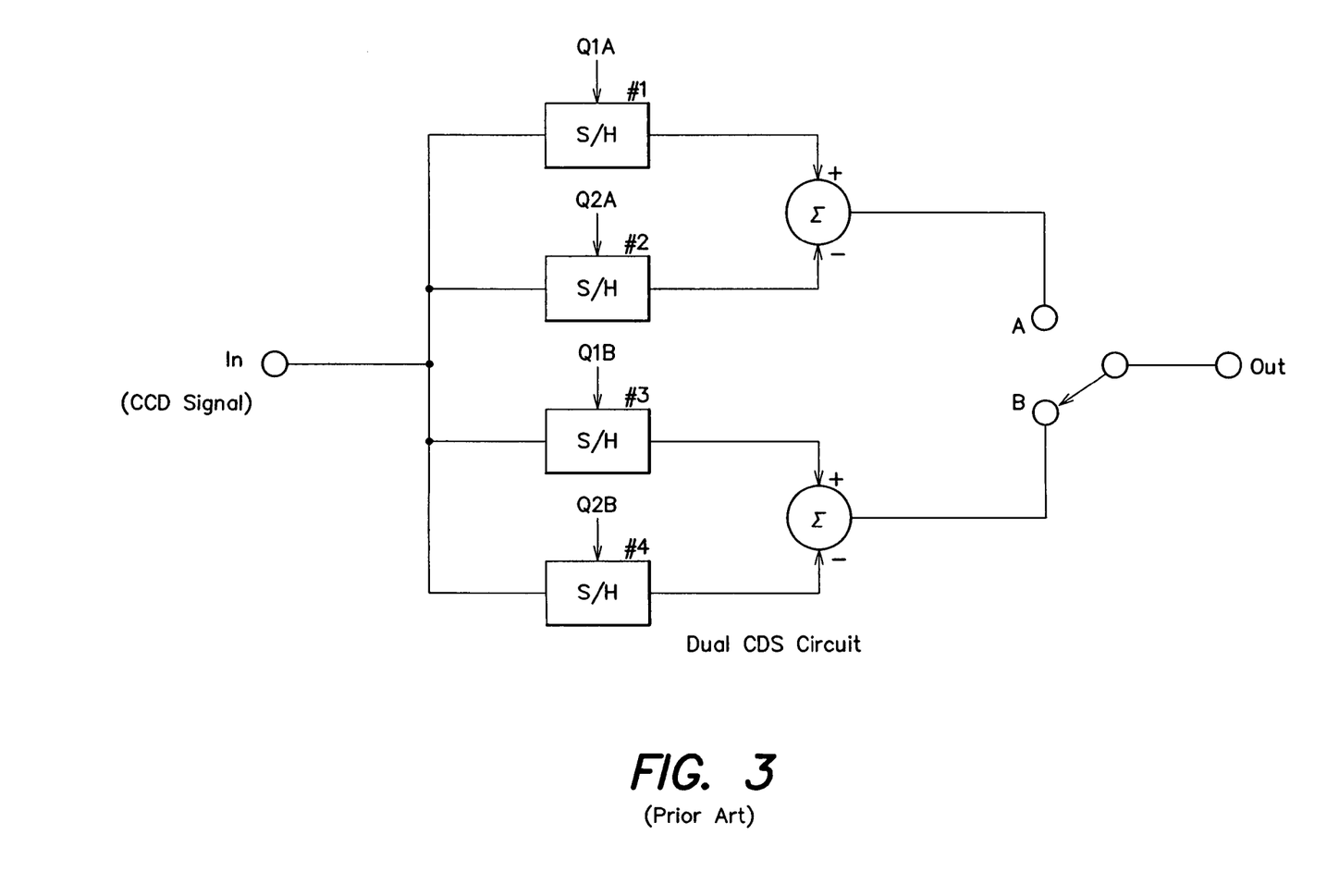
FIG. 3 is a block diagram of a dual CDS circuit according to the prior art.

Another prior art CDS is shown in FIG. 3. This is a dual CDS circuit.

S/H #1 and S/H #2 form a single CDS circuit, and S/H #3 and S/H #4 form a second single CDS circuit. Each single CDS processes alternate pixels. Thus, two CDS circuits are required to process all pixels.

The dual CDS has four phases of operation. In the Q1A phase, the reset level of the first pixel is sampled by S/H #1. The output switch is set to B. In the Q1B phase, the data level of the first pixel is sampled by S/H #2. The output switch is set to B. In the Q2A phase, the reset level of the second pixel is sampled by S/H #3. The output switch is set to A. In the Q2B phase, the data level of the second pixel is sampled by S/H #4. The output switch is set to A.

Compared to the pipeline CDS of FIG. 1, the dual CDS has lower noise because only two sampling operations are performed for each pixel. Also, the AGC has a full period to sample each pixel.

Drawbacks of the dual CDS scheme include: (1) two CDS circuits are required because the previous pixel value must be held while the reset level of the next pixel is sampled; and (2) even and odd pixels use different CDS circuits, causing gain and offset errors which must be removed.

SUMMARY

Applicants herein have discovered that in both prior art techniques, it is difficult to apply a variable pixel gain within the CDS.

The present invention is directed to a programmable gain amplifier. In one embodiment, a gain of the amplifier is programmable on a sample-by-sample basis.

The pixel-gain amplifier (PxGA), according to the present invention, may be used to apply a gain, which may be programmed on a pixel-by-pixel basis. This enables a user to compensate for differences in the average signal level between pixels of different colors.

One embodiment of the invention is directed to a pixel gain amplifier circuit including an amplifier having an input and an output. An input capacitor, coupled to the input of the amplifier, samples an input pixel during a first of first and second time phases. A feedback capacitor, coupled between the input and the output of the amplifier, receives charge from the input capacitor during the second time phase.

Another embodiment of the invention is directed to a method of sampling input pixels comprising the steps of: sampling an input pixel during a first of first and second time phases; amplifying the sampled input pixel during the second time phase; and controlling a gain of the amplification for each pixel.

A further embodiment of the invention is a means for varying a gain of an amplifier in a circuit according to a rapid rate. The means may include using a capacitor array. The means may include corresponding the rapid rate to the rate at which pixels are input into the circuit.

BRIEF DESCRIPTION OF THE DRAWINGS

For a better understanding of the present invention, reference is made to the accompanying drawings, which are incorporated herein by reference and in which.

DETAILED DESCRIPTION

Figure 4:
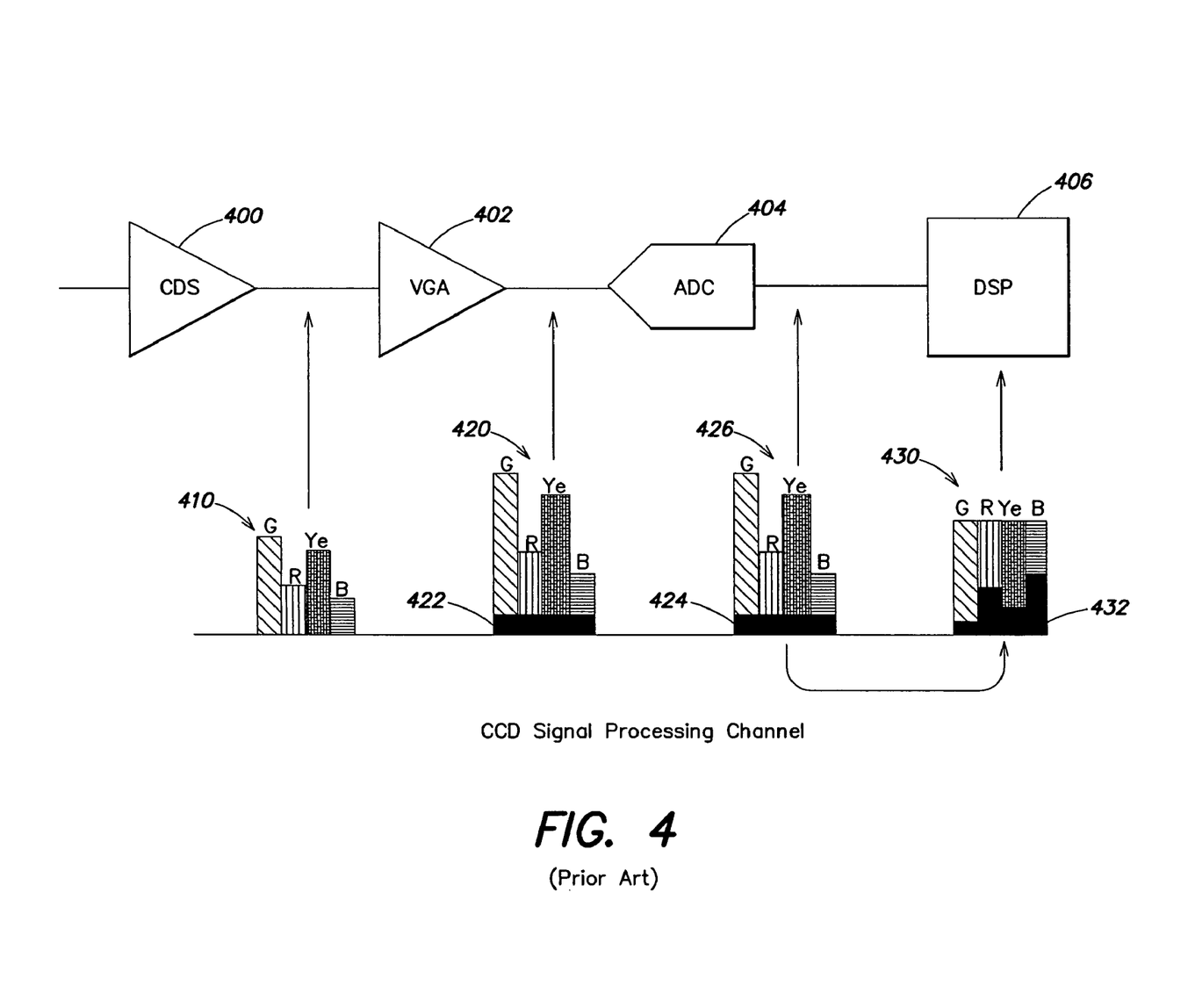
FIG. 4 is a diagram of pixels processed in a CCD signal processing channel according to the prior art.

In addition to the drawbacks of the prior art CDS circuits mentioned above, schemes that correct for errors in a CCD signal neglect the varying amplitudes of the individual pixels which comprise the signal. CCDs utilize color filters to obtain color information. The CCD has different sensitivities to different colors, and as a result, the output amplitude of each pixel will depend not only on the amount of light to which it was exposed, but also on its particular color filter. For example, green pixels typically have a greater amplitude than blue or red pixels. An example of this is shown in FIG. 4. At the output of the CDS 400 four example pixels 410 are shown. Each of these pixels has a different amplitude corresponding to their color: G represents a green pixel, R represents a red pixel, Ye represents a yellow pixel, and B represents a blue pixel. In signal processing of the prior art the pixels 410 are input into a variable gain amplifier 402 to yield amplified pixels 420. As a result of being amplified, each pixel gains a certain amount of noise 422. That noise 422 has the same magnitude for each pixel and is carried through the signal processing channel. Because the pixels have the same amount of noise but different amplitudes, each pixel has a different signal-to-noise ratio. Because the gain of the VGA 402 is limited by the amplitude of the brightest pixel, the pixels which are not as bright are not amplified as much as they could be to achieve the best signal-to-noise ratio.

After the signals are converted by the ADC 404, they still carry with them the noise 422 that was added by the VGA 402. A digital signal processor 406 is typically used to scale the varying amplitudes of the pixels 420 to an equivalent level 430, but the DSP 406 is unable to reduce the noise that the pixels gained in the analog domain. Because the scaling is done to bring each pixel to the same amplitude, the pixels with lower amplitude have a much greater resultant noise 432 than those pixels which started with a greater amplitude.

The only way to avoid the uneven signal-to-noise ratios is to scale the varying amplitudes of the pixels before they are amplified by the VGA 402 or before they reach the ADC 404. This will give each pixel the maximum amount of amplification without saturating the ADC. In order to do this, it must be possible to vary the gain of the amplifier from pixel-to-pixel.

Figure 5:
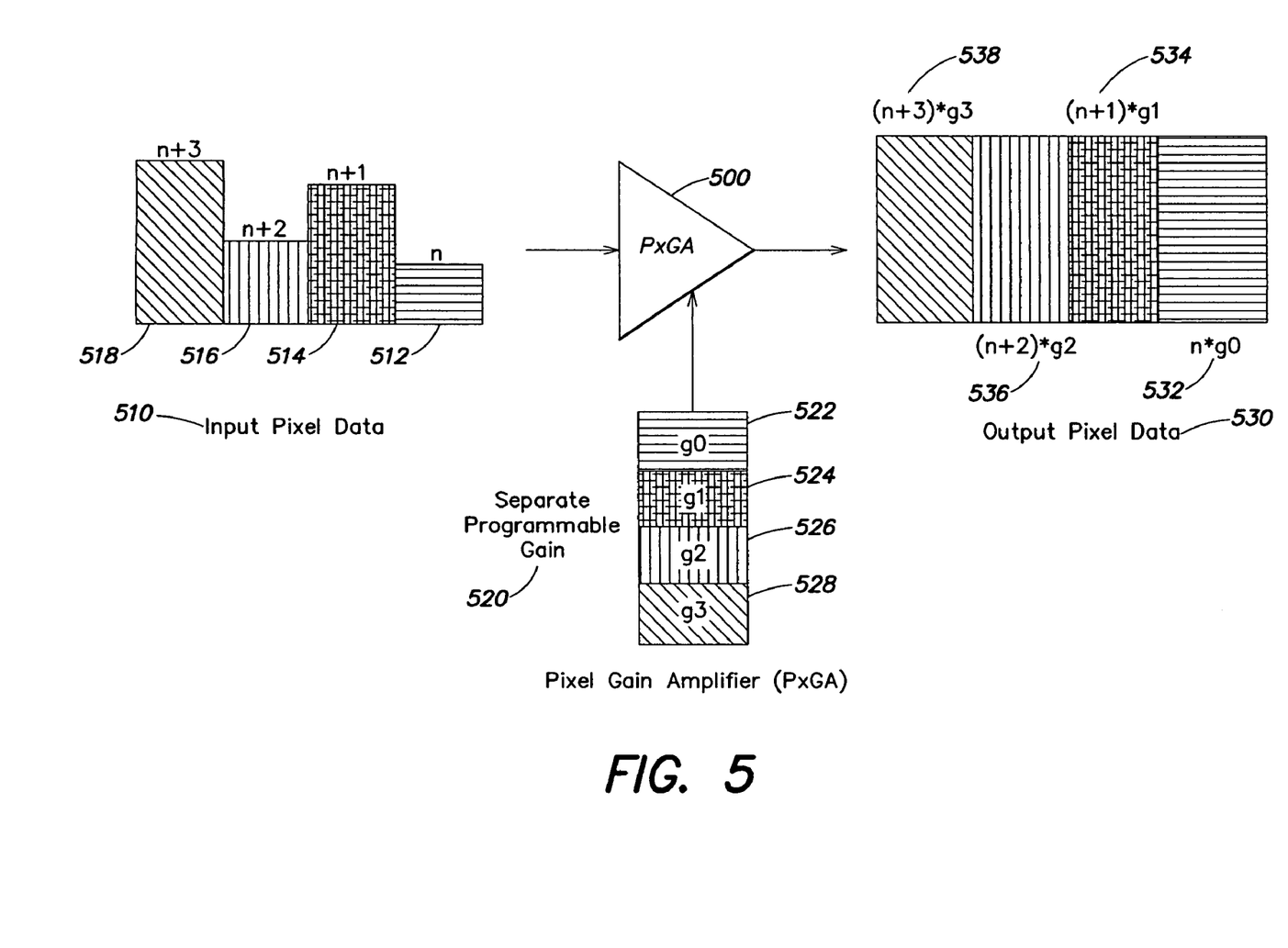
FIG. 5 is a diagram of pixels processed by a pixel gain amplifier.

A pixel gain amplifier (PxGA) is offered for this purpose. As shown in FIG. 5, the pixel gain amplifier 500 takes pixels of varying amplitude in input pixel data 510, amplifies each of them by the separate programmable gain 520 to yield the output pixel data 530 wherein each pixel has the same amplitude. For example, for pixel n 512 a gain of g0 522 is applied to yield the final pixel n*g0 532; for pixel n+1 514 gain g1 524 is applied to yield pixel (n+1)*g1 534, and so forth for the remaining pixels.

Figure 6:
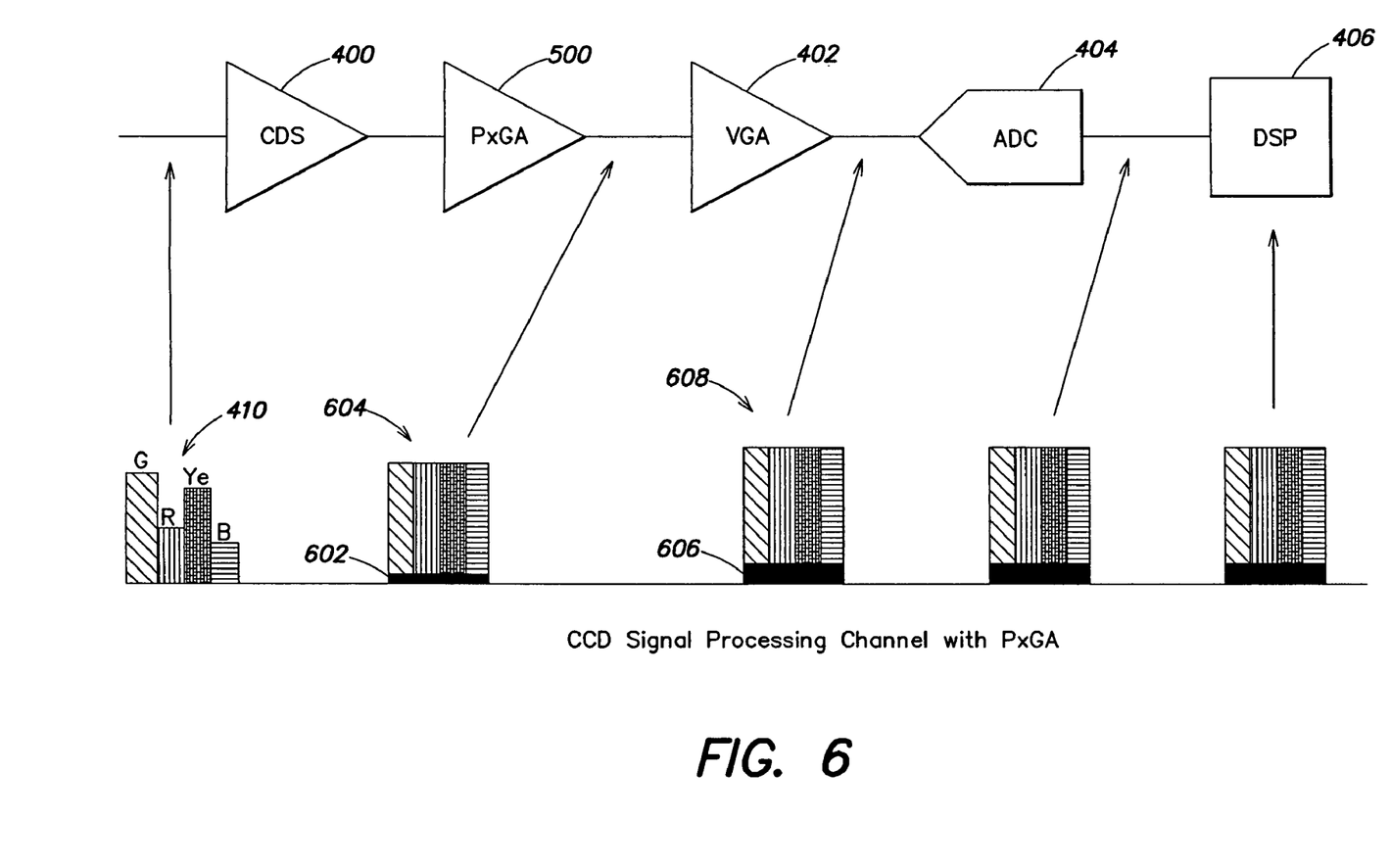
FIG. 6 is a diagram of pixels processed in a CCD signal processing channel using a pixel gain amplifier.

FIG. 6 shows a CCD signal processing channel with the PxGA. The input signal of pixels with varying amplitude 410 is input into the CDS 400. The output of the CDS is sent to the PxGA 500 where the pixels are amplified and scaled to an equal level. The pixel signals 604, along with a slight level of noise 602, are sent to the variable gain amplifier 402 where they are further amplified into the amplified signal 608 plus noise 606. By inserting the PxGA 500 into the channel, the signal-to-noise ratio has been increased for the color pixels which have inherently less sensitivity, yielding a constant signal-to-noise ratio for each pixel. The constant signal-to-noise ratio across pixels allows the ADC 404 to fully utilize its dynamic range.

In order to implement the channel of FIG. 6, the pixel gain amplifier must be able to alter its gain with sufficient speed so that each pixel is appropriately amplified. Prior art amplifiers are insufficient for this purpose.

Figure 7:
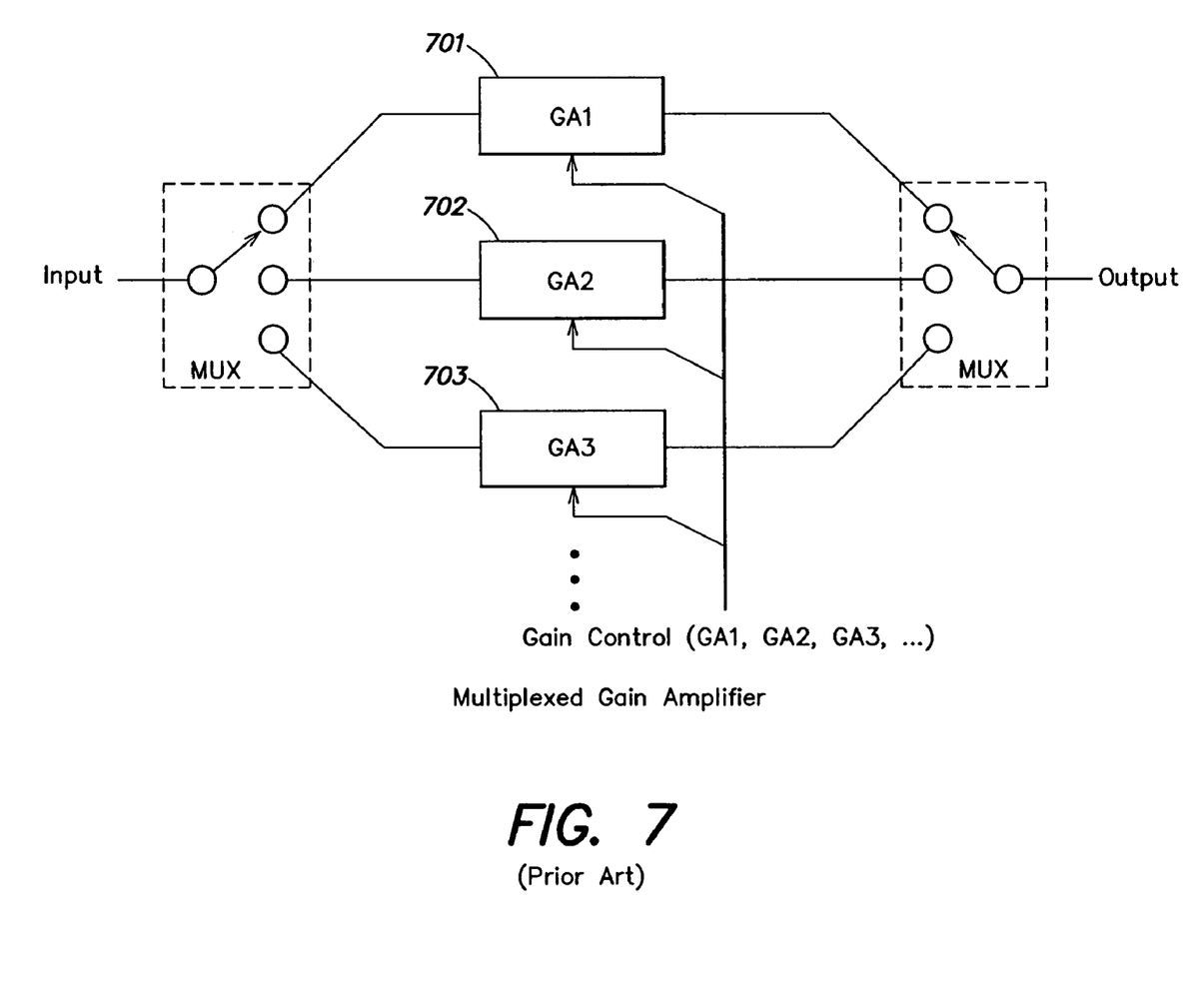
FIG. 7 is a multiplexed gain amplifier according to the prior art.

FIG. 7 shows a multiplexed gain amplifier from the prior art. This example of an insufficient amplifier is a large circuit requiring multiple channels which consumes a great deal of power. Furthermore, each individual gain amplifier 701, 702, 703, etc., creates its own individual offset; each gain amplifier offset is different than the next, which leads to a mismatch of offsets to the output of a multiplexed gain amplifier. The non-linearity and gain mismatch among the gain amplifiers of the amplifier of FIG. 7 serve to further decrease its performance and make it unsuitable for the high speed variable gain task required by a CCD input.

The PxGA offered is suitable for high speed variable gain tasks such as image applications (e.g., image sensors) for pixel sampling, wherein the gain of the PxGA is programmable on a pixel-by-pixel basis. It should be appreciated that the invention is not so limited to this particular embodiment. For example, the invention need not be limited to image applications in which pixels are sampled.

One embodiment described herein is directed to a switched-capacitor amplifier circuit for sampling input voltages. Again, the invention need not be limited to a switched-capacitor circuit.

Figure 8A:
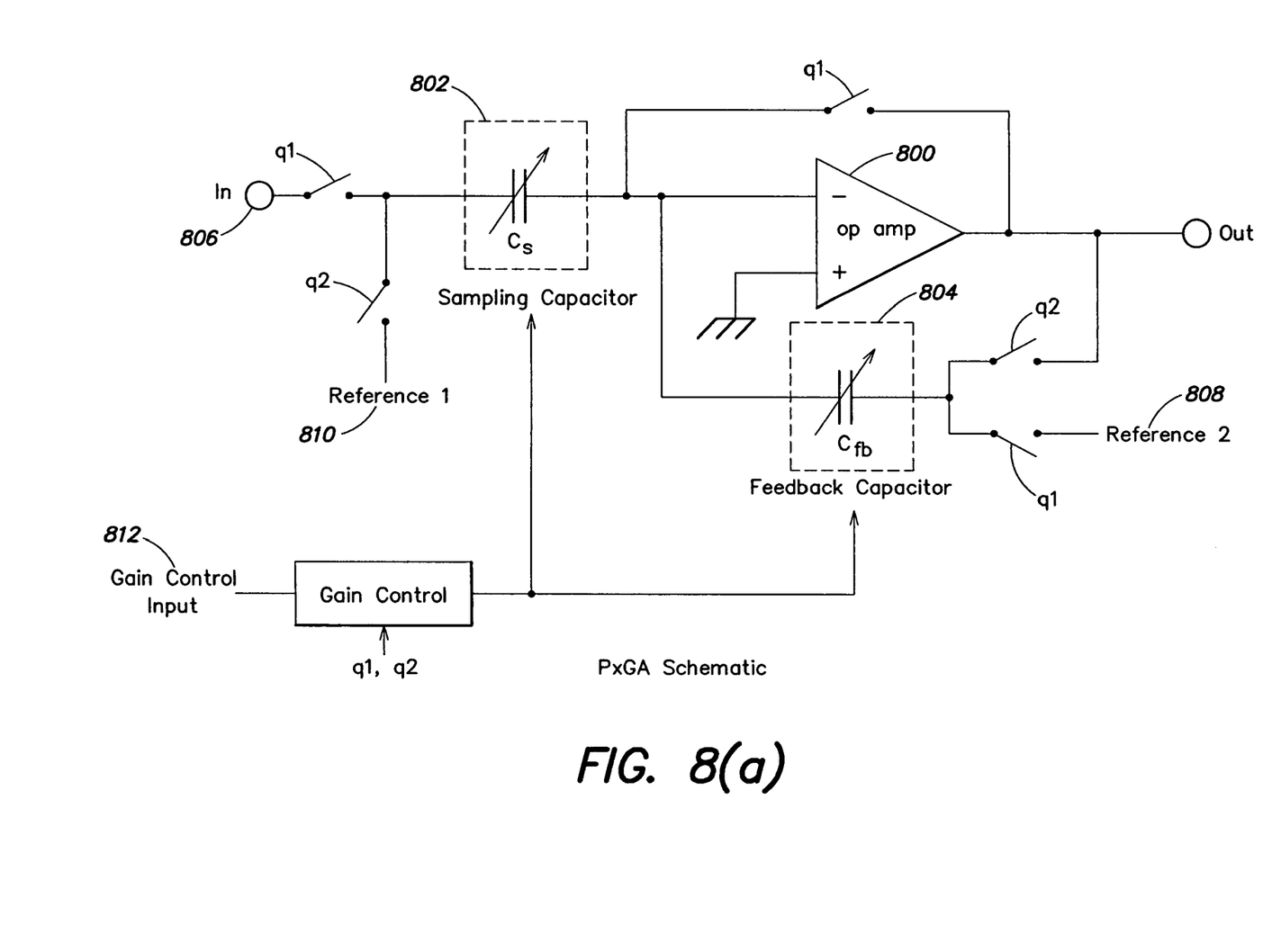
FIG. 8(a) is a block diagram of a pixel gain amplifier circuit.
Figure 8B:
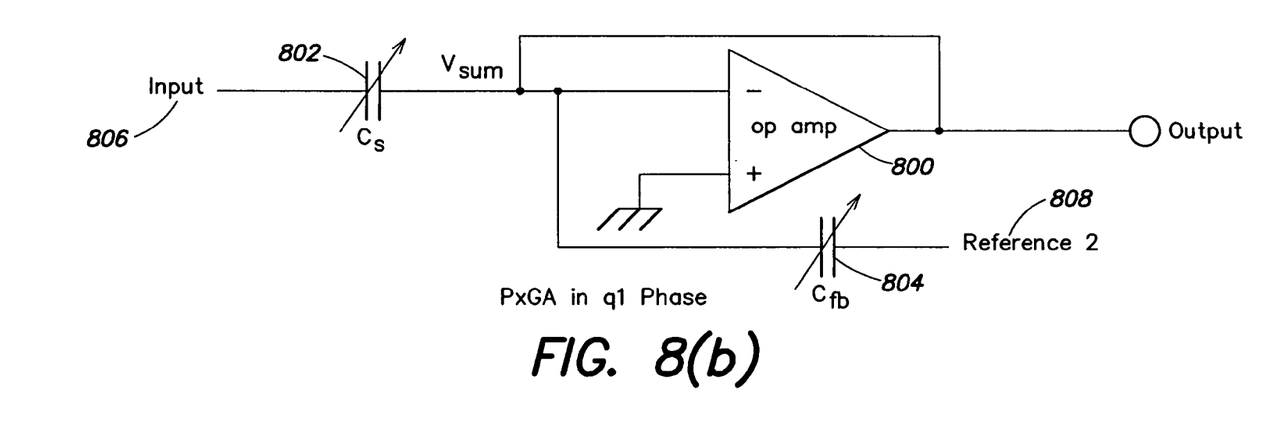
FIG. 8(b) is a block diagram of a pixel gain amplifier circuit in the first phase.
Figure 8C:
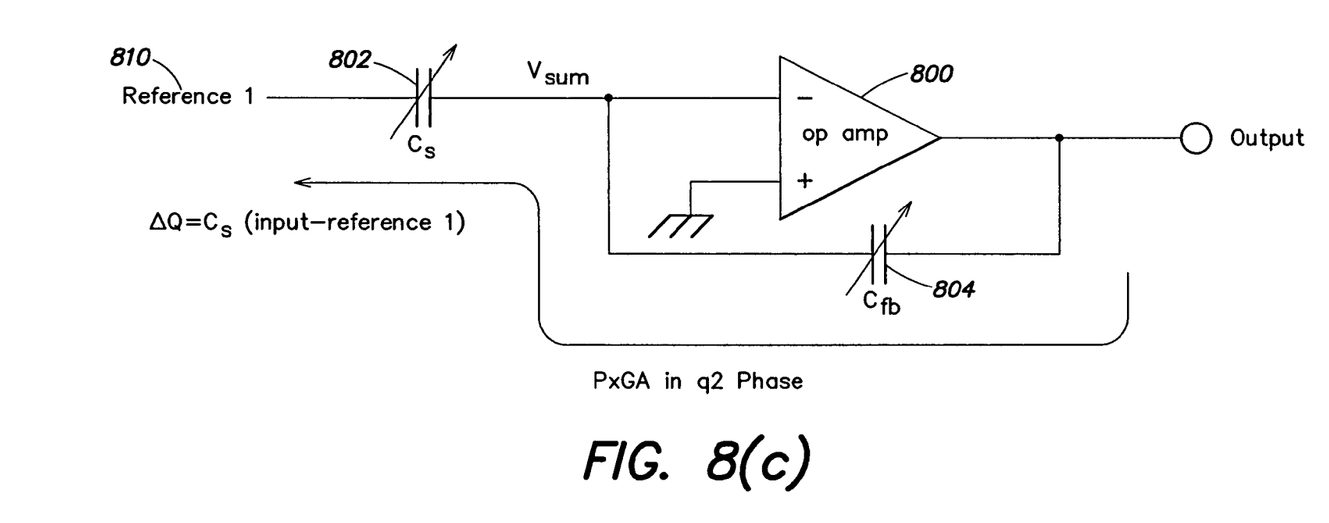
FIG. 8(c) is a block diagram of a pixel gain amplifier circuit in the second phase.

FIG. 8 shows simplified diagrams for a switched-capacitor circuit, according to one embodiment, which performs pixel gain. This circuit employs two time phases (q1 and q2) of operation.

In the reset (q1) phase, shown in FIG. 8(b), the main amplifier 800 is placed in unity-gain feedback to provide a virtual ground at the summing node. The sampling capacitor 802 samples the input 806 and the feedback capacitor 804 samples a reference voltage 808.

In the data (q2) phase, shown in FIG. 8(c), the feedback capacitor 804 is placed in feedback around the main amp 800 and the voltage applied to the sampling capacitor 802 changes by input-reference1. Reference1 810 is a DC bias reference voltage. This forces a charge $\Delta Q = Cs$ (input-reference1) to shift from Cs 802 to Cfb 804, resulting in an output signal of (Cs/Cfb)(input-reference1).

By changing the capacitance values on the sampling capacitor 802 and/or the feedback capacitor 804, Cs and/or Cfb from pixel-to-pixel, the gain can be changed at the pixel rate. The input sampling capacitor 802 and/or the feedback capacitor 804 may be variable for this purpose. The gain control input 812 provides gain information which, in combination with the instantaneous digital switching, controls the capacitor gain.

Figure 9:
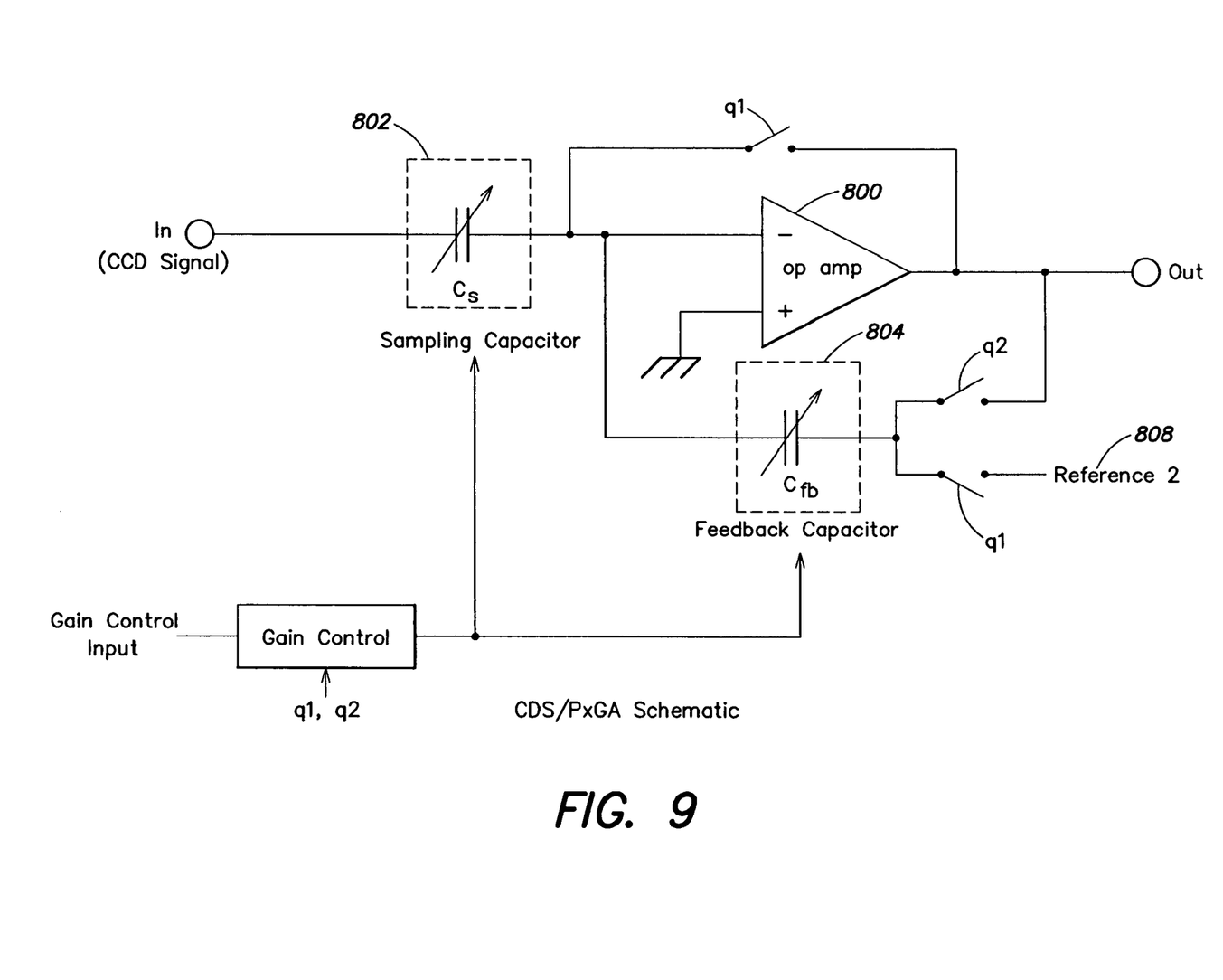
FIG. 9 is a block diagram of a CDS/PxGA circuit.

With a restructuring of the circuit of FIG. 8, a circuit which performs the function of both a PxGA and a CDS is created. The circuit of FIG. 9 shows the combination. Since the architecture of FIG. 9 can simultaneously implement the CDS and PxGA functions, it will be referred to as a CDS/PxGA.

Figure 10:
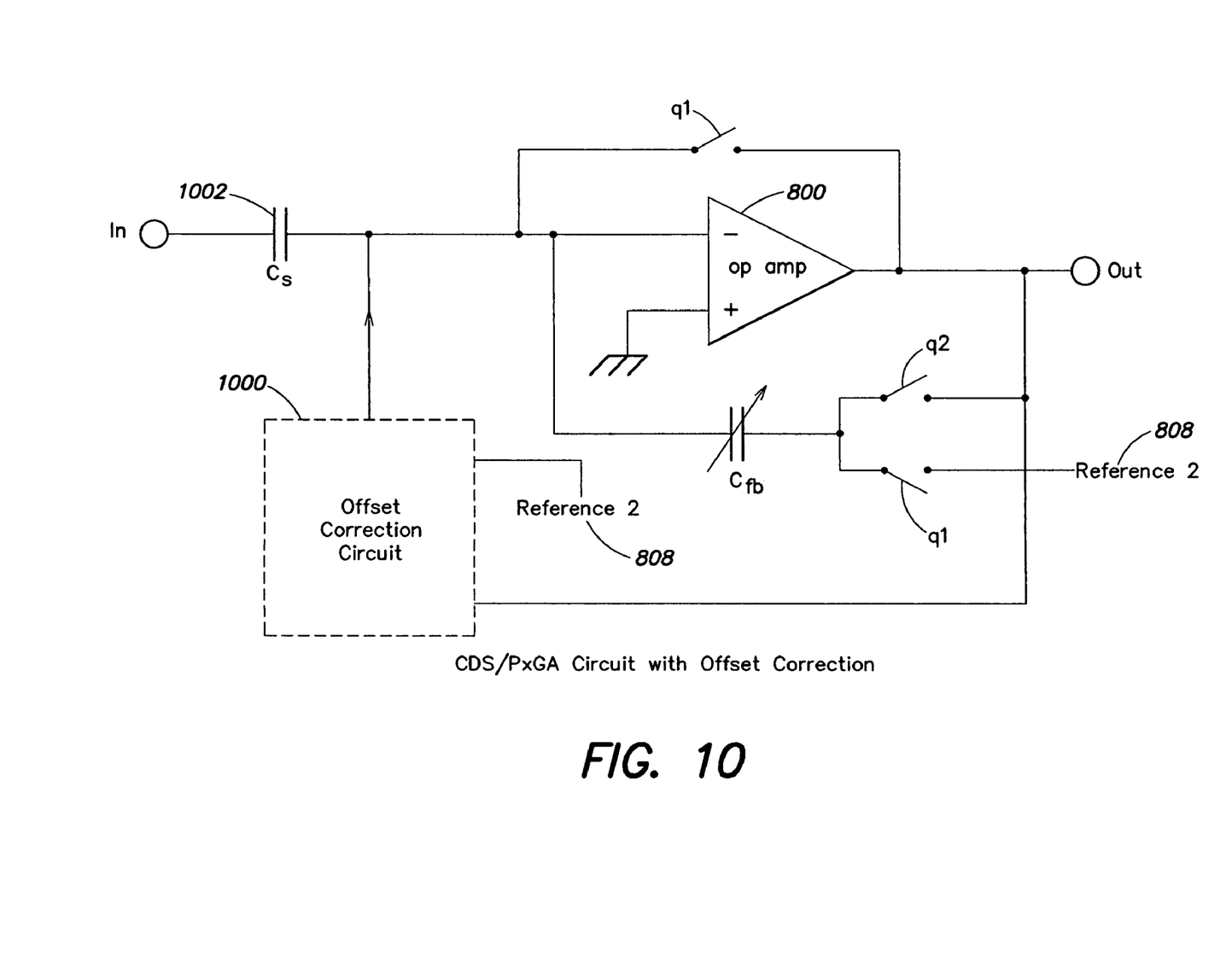
FIG. 10 is a block diagram of a CDS/PxGA circuit with offset correction.

FIG. 10 shows a scheme for implementing offset correction in this CDS/PxGA. Offset correction prevents the AGC from saturating when large gains are applied to small-amplitude input signals. The offset correction circuit 1000 samples the CDS/PxGA output and applies a correction signal to the summing node. The magnitude and sign of the correction signal is the same for all pixels, and is chosen so that during a "black pixel" interval where the input signal corresponds to black pixels, the output is zero. The preferred implementation of this offset correction circuit 1000 is with a fixed-value sampling capacitor Cs 1002, as indicated in FIG. 10.

Figure 11:
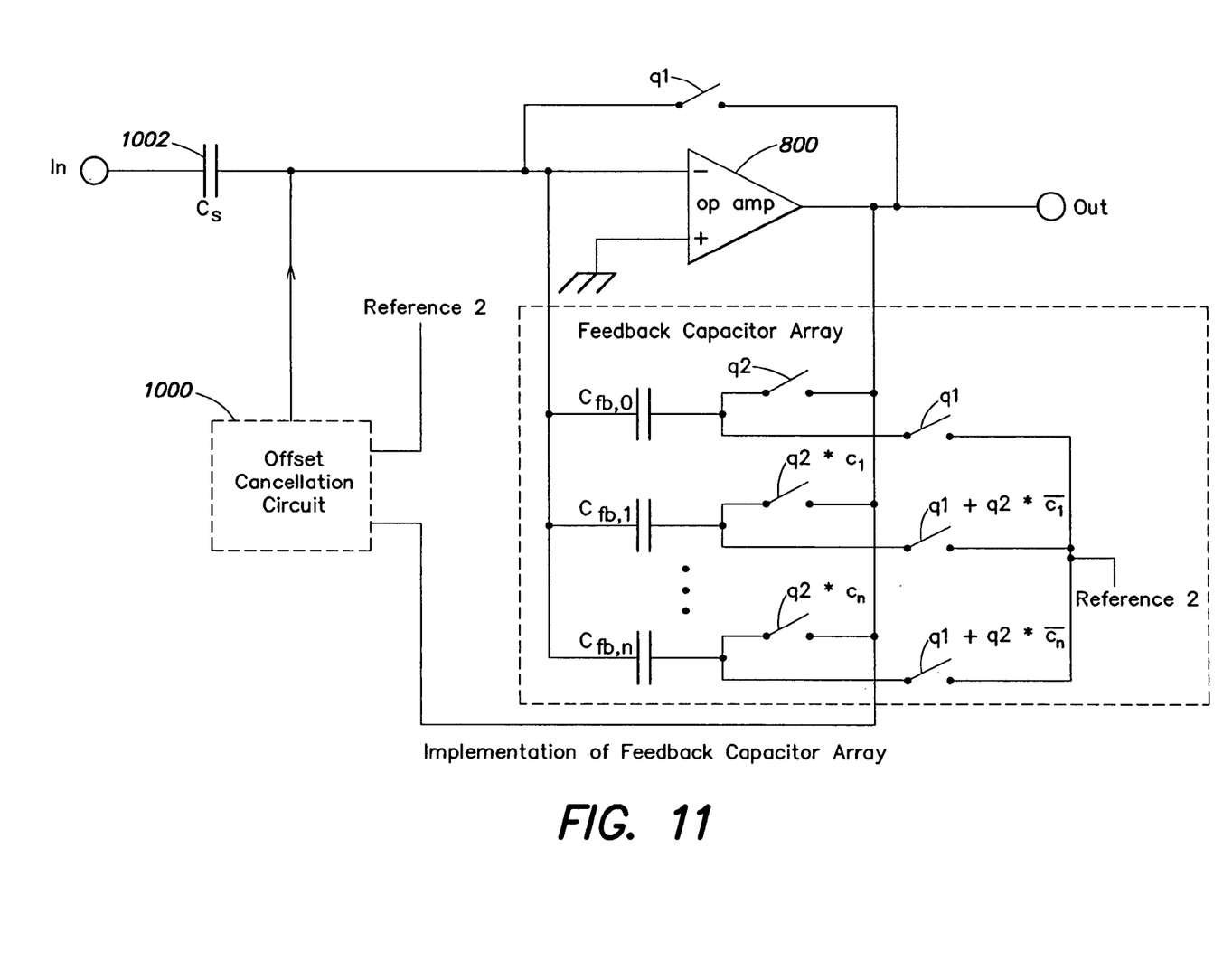
FIG. 11 is a block diagram of a CDS/PxGA amplifier circuit with an expanded diagram of the feedback capacitor array.

FIG. 11 shows one implementation for the variable feedback capacitor. There is a separate capacitor Cfb,i in the cap array for each gain setting i, 0<i<n, and the capacitors are used cumulatively: the i-th gain setting places Cfb,0, Cfb,1, . . . Cfb,i in feedback, and the total feedback capacitance Cfb is the sum of these capacitors. The bits ci determine the gain setting. Note that Cfb,0 is always placed in feedback in the q2 phase, so there is always at least one capacitor in the feedback capacitor array.

Advantages of the CDS/PxGA include: (a) the PxGA operation is performed simultaneously with the CDS operation, so no extra circuit is required; (b) a simple method can be used for offset correction, independent of pixel gain; (c) the PxGA gain curve is guaranteed monotonic; and (d) all pixels are processed through the same signal path, avoiding pixel-to-pixel offset.

Having thus described at least one illustrative embodiment of the invention, various alterations, modifications and improvements will readily occur to those skilled in the art. Such alterations, modifications and improvements are intended to be within the spirit and scope of the invention. For example, the invention need not be limited to image applications in which pixels are sampled, nor need it be limited to a switched capacitor circuit. Accordingly, the foregoing description is by way of example only and is not intended as limiting. The invention is limited only as defined in the following claims and the equivalents thereto.

What is claimed is:

1. A correlated double sampling pixel gain amplifier circuit comprising:
    an input and an output; an amplifier having an input and an output;
    an input capacitor onto which input capacitor charge from an input pixel is sampled during a first of first and second time phases, wherein the input capacitor is functionally coupled to the input of the amplifier and to the input of the pixel gain amplifier circuit during the first and second time phases; and
    a feedback capacitor, coupled between the input and the output of the amplifier, that samples a reference voltage during the first time phase and receives charge from the input capacitor during the second time phase.

2. The pixel gain amplifier circuit as claimed in claim 1 wherein the input capacitor includes a variable capacitor.

3. The pixel gain amplifier circuit of claim 2 wherein a capacitance of the input capacitor changes at a rate corresponding to a rate at which pixels are input into the circuit pixel gain amplifier.

4. The pixel gain amplifier circuit as claimed in claim 1 wherein the feedback capacitor includes a variable capacitor.

5. The pixel gain amplifier circuit as claimed in claim 4 wherein the feedback capacitor comprises a capacitor array.

6. The pixel gain amplifier circuit of claims 4 or 5 wherein a capacitance of the feedback capacitor changes at a rate corresponding to a rate at which pixels are input into the circuit pixel gain amplifier.

7. The pixel gain amplifier circuit as claimed in claim 1 further comprising an offset correction circuit.

8. The pixel gain amplifier circuit of claim 7, wherein an input of the offset correction circuit is coupled to the output of the amplifier and an output of the offset correction circuit is coupled to the input of the amplifier.

9. The pixel gain amplifier circuit of claim 1, wherein the input capacitor and the feedback capacitor at least partially determine a gain of the circuit pixel gain amplifier, and wherein said gain is variable.

10. The pixel gain amplifier circuit of claim 9, further comprising means for changing said gain at the pixel rate.

11. The pixel gain amplifier circuit of claim 1, wherein the charge sampled onto the input capacitor comprises charge corresponding to pixel data and charge corresponding to reset noise.

12. A correlated double sampling pixel gain amplifier circuit comprising:
    an input and an output;
    an amplifier having an input, an output and a gain; and
    means for varying the gain of the amplifier from a first gain for a first pixel to a second gain for a second pixel, wherein the first and second gains are determined, at least in part, by an input capacitor and a feedback capacitor;
    wherein the input capacitor is always functionally coupled to the input of the amplifier and to the input of the pixel gain amplifier circuit.

13. The pixel gain amplifier circuit according to claim 12 wherein the means for varying the gain of the amplifier includes a capacitor array.

14. The pixel gain amplifier circuit according to claim 12 wherein the means for varying the gain of the amplifier comprises means for varying the gain of the amplifier at a rate corresponding to a rate at which pixels are input into the circuit pixel gain amplifier.

15. The pixel gain amplifier circuit of claim 12, wherein the input capacitor is a variable capacitor.

16. The pixel gain amplifier circuit of claim 12, wherein the feedback capacitor is a variable capacitor.

17. The pixel gain amplifier circuit of claim 12, further comprising an offset correction circuit, wherein an input of the offset correction circuit is coupled to the output of the amplifier and an output of the offset correction circuit is coupled to the input of the amplifier.

* * * * *

UNITED STATES PATENT AND TRADEMARK OFFICE
CERTIFICATE OF CORRECTION

| | | |
|---|---|---|
| PATENT NO. | : 7,123,301 B1 | Page 1 of 1 |
| APPLICATION NO. | : 09/579646 | |
| DATED | : October 17, 2006 | |
| INVENTOR(S) | : Katsufumi Nakamura et al. | |

It is certified that error appears in the above-identified patent and that said Letters Patent is hereby corrected as shown below:

Col. 5, lines 40-41, "circuit pixel gain amplifier." should read -- pixel gain amplifier circuit. --

Col. 5, line 49, "circuit pixel gain amplifier." should read -- pixel gain amplifier circuit. --

Col. 6, line 9, "circuit pixel gain amplifier," should read -- pixel gain amplifier circuit, --

Col. 6, line 36, "circuit pixel gain amplifier." should read -- pixel gain amplifier circuit. --

Signed and Sealed this

Sixth Day of March, 2007

JON W. DUDAS
*Director of the United States Patent and Trademark Office*